United States Patent [19]

Sointula

[11] Patent Number: 5,555,450
[45] Date of Patent: Sep. 10, 1996

[54] RADIO PHONE AND METHOD OF OPERATING A RADIO PHONE

[75] Inventor: Erkka Sointula, Märynummi, Finland

[73] Assignee: Nokia Mobile Phones Ltd., Finland

[21] Appl. No.: 228,862

[22] Filed: Apr. 18, 1994

[30] Foreign Application Priority Data

Apr. 26, 1993 [FI] Finland .................................... 931872

[51] Int. Cl.$^6$ ........................................................ H04B 1/38
[52] U.S. Cl. .............................................. 455/89; 455/127
[58] Field of Search .............................. 455/127, 89, 90, 455/234.1, 249.1, 237.1, 311, 296

[56] References Cited

U.S. PATENT DOCUMENTS

| | | | |
|---|---|---|---|
| 3,980,964 | 9/1976 | Grodinsky | 330/29 |
| 4,636,741 | 1/1987 | Mitzlaff | 330/127 |
| 4,949,016 | 8/1990 | De Bijl et al. | 315/208 |
| 5,095,541 | 3/1992 | Aisaka et al. | 455/89 |
| 5,101,507 | 3/1992 | Jung | 455/127 |
| 5,142,695 | 8/1992 | Roberts et al. | 455/89 |
| 5,146,614 | 9/1992 | Furuno | 455/89 |
| 5,193,219 | 3/1993 | Tamura | 455/89 |
| 5,259,018 | 11/1993 | Grimmett et al. | 379/58 |
| 5,303,395 | 4/1994 | Dayani | 455/127 |
| 5,436,550 | 7/1995 | Arakawa | 323/222 |

OTHER PUBLICATIONS

Finnish Office Action dated 26 Nov. 1993 on priority Finnish Application 931872 and English translation thereof.

Primary Examiner—Reinhard J. Eisenzopf
Assistant Examiner—Gertrude Arthur
Attorney, Agent, or Firm—Perman & Green

[57] ABSTRACT

The present invention relates to a procedure for using a radio phone (2) with an external amplifying device (1) for receiving, amplifying and transmitting a radio frequency reception signal to the radio phone, in which radio phone a reception frequency signal is supplied to a front end amplifier (9). When the external amplifying device (1) is connected to the radio phone, the front end amplifier (9) of the radio phone is bypassed or the gain thereof (9) is adjusted to be lower. The control signal (OHJ) is preferably a voltage control signal of direct voltage frequency or low frequency produced in the amplifying device (1), which in the amplifying device is added into the reception signal, and in the radio phone separated from the reception signal into a control signal of the front end amplifier.

15 Claims, 2 Drawing Sheets

RADIO PHONE AND METHOD OF OPERATING A RADIO PHONE

FIELD OF THE INVENTION

The present invention relates to a procedure for using a radio phone with an external amplifier for receiving, amplifying and transmitting a radio frequency signal received to a radio phone in which radio phone a reception frequency signal is fed to a front end amplifier. The invention also relates to a radio phone and an external amplifier for implementing the procedure.

BACKGROUND TO INVENTION

Currently, both car phones and hand-held phones are used in radio phone networks. The greatest difference therebetween is the higher output power of the car phone and the greater requirements as regards sensitivity and error repetitions. In the present patent application the characteristic features of the car phone also refer to the properties of a combination of a hand-held phone and an amplifier i.e. booster.

In the prior art designs a booster comprises a synthesizer, a processor and radio unit of its own, in addition to the standard RF components. One of the state of the art designs is the so-called serial number transmission system in which the booster is a complete car phone without a fixed serial number of its own, i.e. a so-called NAM booster (Number Assignment Module). When a phone is connected to a booster, the NAM data, comprising the phone number of the phone, is transmitted electrically to the booster which thereafter serves ms a phone, and the hand-held phone serves thereafter merely as an operating means, in other words, no RF connection between the hand-held phone and the booster exists.

In another conventional design, the booster comprises two duplex filters (one for the phone terminal and the other for the antenna terminal), and rf components therebetween. An advantage of the design is a simple RF connection, comprising only one coaxial cable between the booster and the telephone. A drawback of the design is that higher performance values are required of the hand-held phone than the specifications set for the radio phone system would usually require of it, so that because of the booster, the hand-held phone has to be produced with unnecessary high performance, resulting in it being expensive to produce and manufacture.

The prior art technology is described below referring to the accompanying FIG. 1, showing the principle of how to combine a hand-held phone and an amplifying means known in the art.

FIG. 1 presents a combination of a hand-held phone and an amplifying means known in the art. A connection point for the amplifying means 1 and the hand-held phone 2 is an antenna terminal 3 of the hand-held phone 2. Instead of a standard antenna, the hand-held phone 2 is connected to an amplifying means 1, that is, to a booster 1, which is usually also connected via a duplex filter 6' to an antenna ANT. A duplex filter 6 is placed between the receiver branch $RX_v$, the preamplifier 4 of the amplifying means 1 and the power surge 5 of the transmission branch $TX_v$. A duplex filter 7 of similar type is provided in the hand-held phone 2. The duplex filters 6 and 7 separate the transmission and reception frequencies within the amplifier into their equivalent branches, these being respectively amplified.

In the state of the art there is a difficulty in implementing the properties required of the hand-held phone. Owing to the attenuation caused by the duplex filters of the booster, the signal has to be amplified in the booster with an amplifier 4 in order to meet the sensitivity requirements. Now, the signal processing properties of the combination provided by the booster 1 and the hand-held phone 2, such as spurious response properties (high signal handling, intermodulation etc), are deteriorated, said properties being mainly limited by the high frequency parts of the hand-held phone. The problem has to some extent been ameliorated by increasing the supply current of the front end stage (not shown) of the hand-held phone. However, the increased current consumption in using the hand-held phone leads to shortened life time of the hand-held phone or to the use of more powerful batteries, this being entirely contrary to the well known objectives of increased battery life and/or low volume and weight of hand-held phones. In addition, since a reception signal amplified already in an external amplifier is conducted to the front end amplifier of the radio phone, intermodulation effects in the signal are exacerbated.

SUMMARY OF THE INVENTION

In a first aspect of the present invention there is provided a radio phone adapted for coupling to an external amplifying means, comprising a reception branch and a transmission branch, the reception branch being provided with a front end amplifier for amplifying a received radio frequency signal, wherein a control signal is coupled to the radio phone when the external amplifying means is coupled to the radio phone for controlling amplification of the received radio frequency by the front end amplifier, and in a second aspect of the invention there is provided a method of operating a radio phone with an external amplifying means for receiving, amplifying and transmitting a radio frequency reception signal to and from a radio phone, in which radio phone, the reception frequency signal is supplied to a front end amplifier, wherein when the external amplifying means is coupled to the radio, phone, the front end amplifier of the radio phone is bypassed or the gain thereof is reduced.

The advantage of the present invention is that it provides a combination of a radio phone and an external amplifier means connected thereto in which the intermodulation and noise factor problems occurring in the state of art combinations are inhibited.

DESCRIPTION OF EMBODIMENTS OF THE INVENTION

Figure 1:
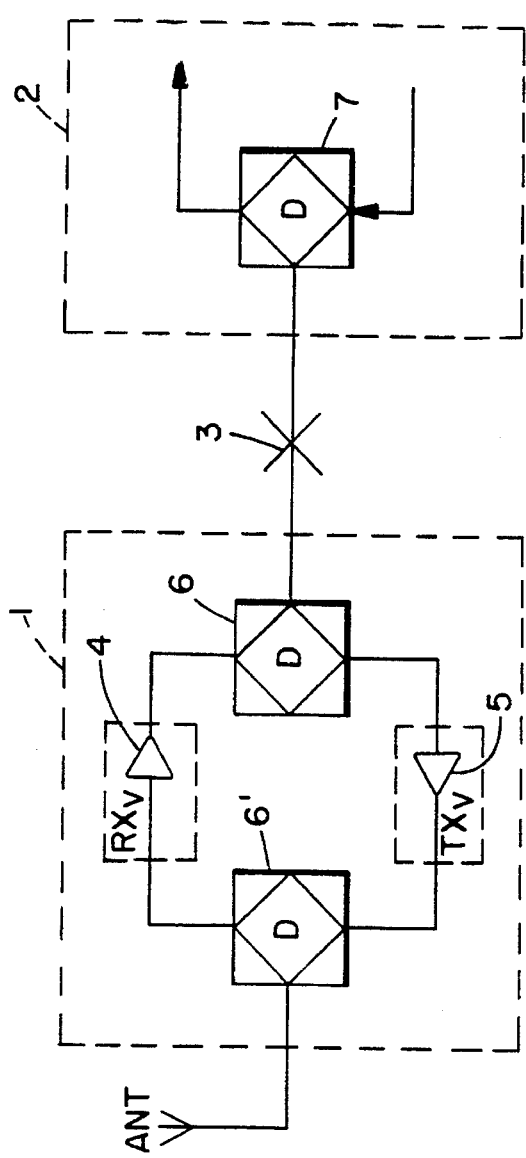
FIG. 1 presents the principle of a combination of a prior art hand-held phone and an amplifier.
Figure 3:
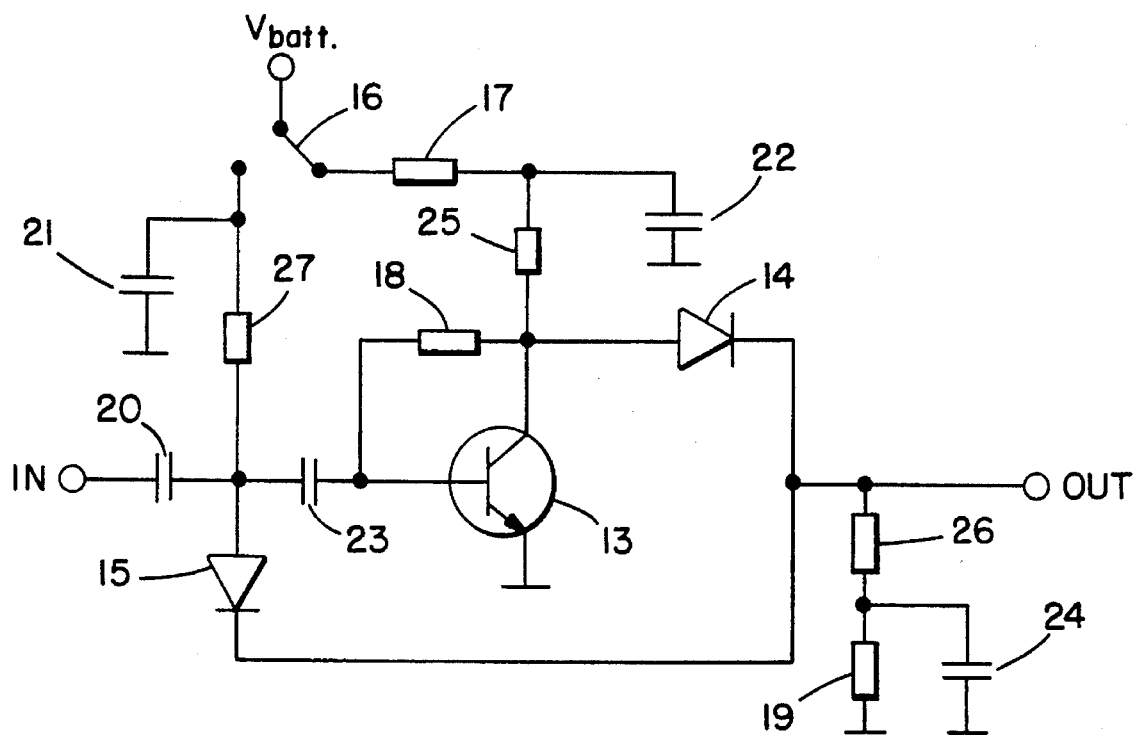
FIG. 3 shows an example of a principle circuit diagram of a front end amplifier of the reception branch of the radio phone used for implementing the invention.
Figure 4:
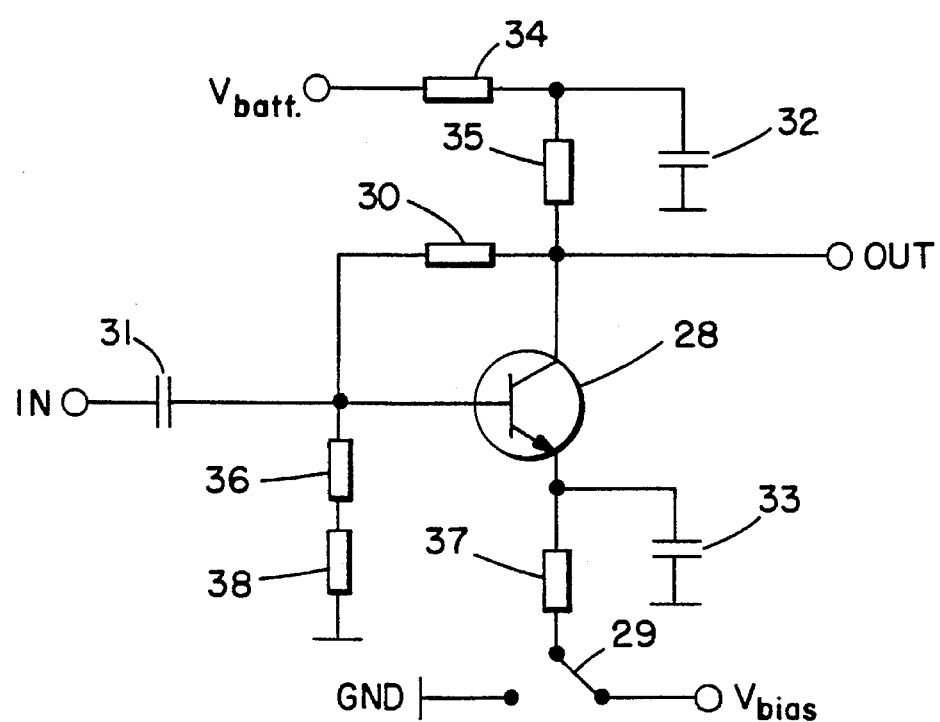
FIG. 4 shows another example of a principle circuit diagram of a front end amplifier of the reception branch of the radio phone used for implementing the invention.

FIG. 1 is described above. The method and the design of the invention are described below in detail referring to FIGS. 2 to 4 presenting an implementation of the design of the invention.

Figure 2:
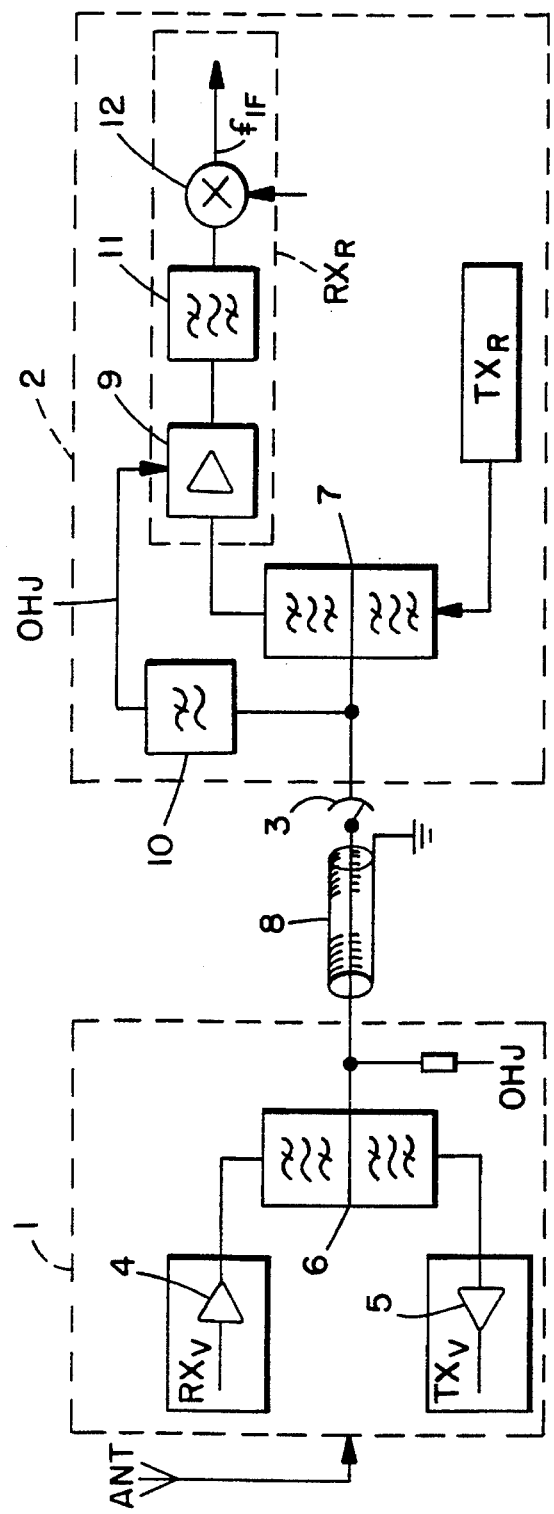
FIG. 2 presents, according to the invention, a block diagram of a combination of radio phone and an amplifier.

FIG. 2 shows a circuit diagram of a combination of a radio phone and an amplifier in accordance with the invention. A connection between the amplifier 1 and the radio phone 2 is a coaxial cable 8 (usually) or equivalent cable for implementing an rf connection. The amplifier 1 comprises a reception branch $RX_v$ (merely front end amplifier 4 shown) and a transmission branch $TX_v$, (merely power amplifier stage 5 shown) and a duplex filter 6 produced from e.g. bandpass filters separating the transmission and reception frequency signals therebetween into their respective branches.

When a booster 1 is connected to a radio phone 2, an antenna ANT is connected to the booster 1. A control signal OHJ is added into a received, amplified, radio frequency reception signal emitted from the antenna ANT and is supplied to the radio phone 2 via a coaxial cable 8, which control signal can be a direct voltage signal or a low frequency voltage signal. The direct voltage signal can be produced directly from the supply voltage of the booster or modified therefrom e.g. with a dc/dc converter. Alternatively, a low-frequency control signal OHJ can be produced from the supply voltage of the booster using e.g. a dc/ac converter. The control voltage OHJ provides the radio phone 2 with the information that a booster has been connected thereto. The control signal OHJ need not necessarily be produced in the booster, but can be input to the radio phone from an external additional apparatus connected to the radio phone, such as a data adapter or an additional earphone. In such an embodiment, the control signal OHJ is not added in a received radio frequency signal; instead, it is carried via a terminal of the additional apparatus to the radio phone 2.

The radio phone is also provided with a duplex filter 7 produced e.g. from two band pass filters. The connection between the amplifier 1 and the radio phone 2 is usually implemented by connecting the amplifier together with a coaxial cable 8 connected between the duplex filters 6 and 7. The reception signal amplified in the booster 1 and carried to the radio phone 2 is conducted from the duplex filter 7 to the receiver $RX_R$ of a radio phone, the first stage usually being a front end amplifier 9. As taught by the invention, for the front end amplifier 9 a controllable or by-passable front end amplifier stage 9 is used, which means that with a control signal OHJ produced in the booster or somewhere else outside the radio phone the front end amplifier 9 of the radio phone is controlled into a stare in which it is bypassed or, alternatively, in which the gain thereof is controlled to be lower. If a voltage control signal OHJ of direct voltage frequency or low-voltage frequency is carried from a booster 1, as happens in the preferred embodiment of the invention, a filter 10, such as low-pass filter, is provided in the radio phone, as shown in FIG. 2, and is positioned such that it bypasses duplex filter 7. Filter 10 prevents the entry of a radio frequency signal into the, control branch, but lets a voltage controlled signal OHJ of direct voltage frequency or low frequency pass therethrough.

In FIG. 2 the amplifier stage 9 is controlled with a control voltage OHJ emitted from the low pass filter 10. From the amplifier stage 9 a radio frequency reception signal is conducted in the reception branch $RX_R$ onwards, e.g. via a band-pass filter 11 to a mixer 12, where the rf signal is mixed to an intermediate frequency $f_{IF}$. The implementation of the reception branch $RX_R$ as well as of the transmission branch $TX_R$ of the radio phone is known to a person skilled in the art, and they will not be examined more closely in the present context.

With the aid of the present invention problems related to intermodulation and noise factor caused by the single coaxial designs known in the art can be avoided. The problems are generally caused by the fact that the reception signal is too greatly amplified by the front end amplifier of the radio phone (from an intermodulation point of view) because it has first been amplified in the booster, when both of the front end amplifiers (i.e. in the booster and in the radio phone) have been adapted to provide the desired noise figure. If instead, gain at the preamp in the booster is set just to compensate the losses in the booster duplexes, the total noise figure will be higher than handheld phones alone. When, as taught by the invention, the front end amplifier of the radio phone is bypassed or the gain thereof is controlled to be lower, and the gain of the front end amplifier 4 of the reception branch $RX_v$ in the booster is equally slightly increased then both inter-modulation and noise factor requirements are met simultaneously. This kind of front end amplifier 4 is easy to implement because no problems are caused by the current consumption.

Implementing both the controllable and the bypassable amplifier is known to a person skilled in the art. As an example, two different bypassable amplifiers appropriate for use in the present invention are described below. The bypass connection of the amplifier used in the invention can be implemented e.g. with separate diode switches. Said diode switches can be switched in series by direct current with a front end amplifier for minimizing the current consumption when no booster is available. In the booster use, a direct voltage control signal controls the bypass switch to be switched on. Alternatively, the amplifier can be so implemented that the rf transistor of the front end stage is biassed to act as a switch in the booster position, or the functional point of the rf transistor is changed in the booster operation to be optimal regarding the signal processing capacity.

FIG. 3 presents a circuit diagram of the first mentioned embodiment of the bypassable amplifier. As is known in the art, the amplifier is provided with an rf transistor 13 as the amplifying component. Hereby, the bypass switching has been implemented with the aid of diode switches 14, 15 and a switch 16 switched to the supply voltage $V_{batt}$ and controlled into two states. When the radio phone is used without a booster, the switch 16 has been switched between the supply voltage $V_{batt}$ and the resistor 17. Now, the diode 14 and the transistor 13 are conducting, and the amplifier 9 amplifies a signal of radio frequency carried to the input IN, which, when amplified, is emitted from the output OUT of the amplifier. When a control signal OHJ enters the front end amplifier 9, the switch 16 is set to the second position, that is, between the supply voltage $V_{batt}$ and a capacitor 21 and a coil 27, whereby the other diode 15 is conducting. Now, the transistor 13 is not supplied with any supply voltage, but the input signal IN travels unamplified directly via the diode 15 to the output OUT. The connection of the amplifier and the other components 17 to 27 presented in the figure are not described here more in detail because their purpose is known to the person skilled in the art. The purpose of FIG. 3 is also otherwise to disclose the principle of implementing a bypassable amplifier, thus the entire circuit diagram of the amplifier is not presented in FIG. 3 in greater detail.

FIG. 4 presents a circuit diagram of the second embodiment, in which an rf transistor 28 is biassed to act as a switch in a booster position. When a radio phone is in operation without a booster, the switch 29 to be controlled is grounded GND. Hereby, the emitter of the rf transistor 28 has been grounded, whereby the transistor 28 is conducting and a reception radio frequency signal carried to the input IN of the amplifier is carried amplified to the output OUT of the amplifier. When the radio phone is connected to a booster, a control signal OHJ is carried to the control of a switch 29 (not shown), whereby the switch 29 is switched to the biasing voltage $V_{bias}$. The biasing voltage $V_{bias}$, is of such magnitude regarding the supply voltage $V_{batt}$ that the voltage difference between the base and the emitter of the transistor 28 is smaller than the threshold voltage of the transistor 28, whereby the transistor 28 is switched to an off state, and whereby an rf signal carried to the input IN passes in attenuated state to the output OUT of the amplifier via a feedback/biasing impedance 30. The connection of the amplifier and the other components 31 to 38 shown in the, figure are not described more in detail in the present context because their purpose is known to the person skilled in the art. Also otherwise, the purpose of FIG. 4 is to present the principle of implementing the amplifier to be bypassed, therefore, in FIG. 4 the entire circuit diagram of the amplifier is not presented in greater detail.

In addition to the fact that e.g. a low-frequency control signal OHJ, controlling the amplifier, enters the radio phone via the rf signal terminal (via antenna terminal), the battery charging current of e.g. a hand-held phone can also be supplied to the same terminal (along the same coaxial cable) into the phone (battery). For setting the power level of the booster, interruptions of various lengths can be modulated in the charge current, to be detected by the booster. This would furthermore lead to reduced need of leads when no separate lead is needed for the charge current.

By the aid of the present invention, intermodulation and noise factor problems occurring in prior art booster-radio phone combinations can be avoided. The invention is not confined to the examples described here, and it can be applied in various ways within the limits of the accompanying claims. It is possible that the external amplifying means of the invention is merely an amplifier of the reception branch or it can be part of the booster, which is also provided with a power amplifier of the transmission branch.

The scope of the present disclosure includes any novel feature or combination of features disclosed therein either explicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. A radio phone system for receiving a radio frequency signal comprising a radio phone circuit selectively connected to an external amplifying means, said external amplifying means including a first front end amplifier and said radio phone circuit including a reception branch and a transmission branch, the reception branch of said radio phone circuit being provided with a second front end amplifier for amplifying a received radio frequency signal, wherein a control signal is coupled to the radio phone circuit when the external amplifying means is selectivity connected to the radio phone circuit for reducing the amplification of the received radio frequency by the second front end amplifier.

2. A radio phone system according to claim 1, wherein the control signal reduces the gain of the front end amplifier.

3. A radio phone system according to claim 1, said reception branch of said radio phone circuit including a switch means connected to the second front end amplifier wherein the control signal bypasses the gain of the front end amplifier.

4. A radio phone system according to claim 1, wherein the control signal is a low-frequency voltage signal.

5. A radio phone system according to claim 4, wherein the control signal is a direct voltage signal.

6. A radio phone system according to claim 1, wherein there is provided a separate terminal for connecting the control signal to the radio phone.

7. A radio phone system according to claim 6, wherein there is provided means coupled between the separate terminal and a control input of the second front end amplifier for separating the control signal from other signals and for coupling the control signal to the control input of the second front end amplifier.

8. Radio phone system according to claim 7, wherein the separate terminal is an antenna terminal of the radio phone suitable for coupling to the external amplifying means, amplifying and for transmitting a radio frequency signal to the radio and the means coupled between the separate terminal and the control input of the front end amplifier comprise a filter for separating the control signal from the radio frequency reception signal.

9. A radio phone system according to claim 8, wherein the filter further comprises an ac/dc converter for converting the low-frequency control signal into a direct voltage signal.

10. A method of operating a radio phone system with an external amplifying means for receiving, amplifying and transmitting a radio frequency reception signal to and from a radio phone circuit in which radio phone circuit the reception frequency signal is supplied to a front end amplifier, wherein when the external amplifying means is coupled to the radio phone, the front end amplifier of the radio phone is bypassed or the gain thereof is reduced.

11. A method according to claim 10, wherein the external amplifying means is coupled to the radio phone circuit, a control signal is coupled to a control input of the front end amplifier, for controlling the front end amplifier of the radio phone circuit is bypassed or the gain thereof to be lower.

12. A method according to claim 11, wherein the control signal is produced in the external amplifying means where it is added into a received radio frequency signal, supplied to the radio phone circuit via an antenna terminal of the radio phone circuit, and it is separated from the radio frequency reception signal in the radio phone circuit and coupled to the front end amplifier.

13. A radio phone system comprising an external amplifying means selectivity connected to a radio phone circuit, said radio phone circuit including an antenna terminal for receiving and transmitting radio frequency signals, means connected to the antenna terminal for separating reception and transmission frequency signals form one another, a reception branch and a transmission branch to amplify respective received and transmitted signals, and second separation means connected to each of the branches to separate the reception and transmission frequency signals into their respective branches, the radio phone being coupled to a terminal point of the second separation-means-common to reception and transmission frequency signals, wherein there is provided means for producing a control signal of a direct voltage or of a low frequency, and for summing these in the radio frequency reception signal in said common terminal point of said second separation means.

14. Amplifying means according to claim 13, wherein there is provided a dc/dc converter for producing a direct voltage control signal from the supply voltage thereof.

15. Amplifying means according to claim 13, wherein there is provided a dc/ac converter for producing a low frequency voltage control signal from the supply voltage thereof.

* * * * *